United States Patent
Hu et al.

(10) Patent No.: US 9,748,386 B2
(45) Date of Patent: Aug. 29, 2017

(54) EPITAXIAL STRUCTURE OF SEMICONDUCTOR DEVICE AND MANUFACTURING METHOD THEREOF

(71) Applicant: UNITED MICROELECTRONICS CORP., Hsin-Chu (TW)

(72) Inventors: I-cheng Hu, Kaohsiung (TW); Tien-I Wu, Taoyuan (TW); Chun-Jen Chen, Tainan (TW); Yu-Shu Lin, Pingtung County (TW); Neng-Hui Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/922,215

(22) Filed: Oct. 26, 2015

(65) Prior Publication Data
US 2017/0117410 A1    Apr. 27, 2017

(51) Int. Cl.
| H01L 29/66 | (2006.01) |
| H01L 29/78 | (2006.01) |
| H01L 29/161 | (2006.01) |
| H01L 29/165 | (2006.01) |
| H01L 29/08 | (2006.01) |
| H01L 21/02 | (2006.01) |

(52) U.S. Cl.
CPC ...... *H01L 29/7848* (2013.01); *H01L 29/0847* (2013.01); *H01L 29/161* (2013.01); *H01L 29/165* (2013.01); *H01L 29/66628* (2013.01); *H01L 29/66636* (2013.01); *H01L 21/0243* (2013.01); *H01L 21/0245* (2013.01); *H01L 21/0262* (2013.01); *H01L 21/02502* (2013.01); *H01L 21/02532* (2013.01); *H01L 21/02639* (2013.01)

(58) Field of Classification Search
None
See application file for complete search history.

(56) References Cited

U.S. PATENT DOCUMENTS

| 8,906,789 B2 | 12/2014 | Tsai |
| 2014/0134818 A1 | 5/2014 | Cheng |
| 2015/0021696 A1* | 1/2015 | Sung ................ H01L 21/82342 257/368 |

OTHER PUBLICATIONS

"U-shaped." Merriam-Webster.com, 2017. Web. (Jan. 6, 2017).*

* cited by examiner

*Primary Examiner* — Reema Patel
(74) *Attorney, Agent, or Firm* — Winston Hsu

(57) ABSTRACT

An epitaxial structure of semiconductor device includes a substrate, a recess, a first epitaxial layer, a second epitaxial layer, and a third epitaxial layer. The recess is formed in the substrate and disposed near a surface of the substrate, wherein the recess has a recess depth. The first epitaxial layer is disposed on surfaces of a sidewall and a bottom of the recess. The second epitaxial layer is disposed on the surface of the first epitaxial layer, wherein the Ge concentration of the second epitaxial layer is greater than the Ge concentration of the first epitaxial layer. The third epitaxial layer is disposed on the surface of the second epitaxial layer, wherein the Ge concentration of the third epitaxial layer is greater than the Ge concentration of the second epitaxial layer, and the depth of the third epitaxial layer is about ½ to about ¾ of the recess depth.

20 Claims, 5 Drawing Sheets

EPITAXIAL STRUCTURE OF SEMICONDUCTOR DEVICE AND MANUFACTURING METHOD THEREOF

BACKGROUND OF THE INVENTION

1. Field of the Invention

The present invention relates to an epitaxial structure of semiconductor device and a manufacturing method thereof, more particularly, to an epitaxial structure of semiconductor device with improved strain effect and a manufacturing method thereof.

2. Description of the Prior Art

The semiconductor integrated circuit (IC) industry has experienced rapid growth. In the course of IC evolution, strained source/drain features have been implemented using epitaxial (EPI) semiconductor materials to enhance carrier mobility and improve device performance. For example, when forming a metal-oxide-semiconductor field effect transistor (MOSFET), silicon germanium (SiGe) may be epitaxially grown to form source and drain features. Various techniques directed at shapes, configurations, and materials of these source and drain features have been implemented to further improve transistor device performance. Although many approaches have been developed for their intended purposes, they have not been entirely satisfactory in all respects. For example, in a conventionally formed SiGe bulk structure, the Ge concentration in Ge region is not as high as expectation, and the Ge region with higher concentration has a certain distance to channel region.

SUMMARY OF THE INVENTION

It is one of the objectives of the present invention to provide an epitaxial structure and manufacturing method thereof, wherein the formed epitaxial structure has improved distribution and arrangement of Ge region with high concentration.

According to an embodiment of the present invention, an epitaxial structure of semiconductor device is provided. The epitaxial structure of semiconductor device includes a substrate, a recess, a first epitaxial layer, a second epitaxial layer, and a third epitaxial layer. The recess is formed in the substrate and disposed near a surface of the substrate, wherein the recess has a recess depth. The first epitaxial layer is disposed on surfaces of a sidewall and a bottom of the recess. The second epitaxial layer is disposed on the surface of the first epitaxial layer, wherein the germanium (Ge) concentration of the second epitaxial layer is greater than the Ge concentration of the first epitaxial layer. The third epitaxial layer is disposed on the surface of the second epitaxial layer, wherein the Ge concentration of the third epitaxial layer is greater than the Ge concentration of the second epitaxial layer, and the depth of the third epitaxial layer is about ½ to about ¾ of the recess depth.

According to an embodiment of the present invention, a manufacturing method of an epitaxial structure is further provided. The manufacturing method includes providing a substrate, wherein a recess is disposed in the substrate near a surface of the substrate; forming a first epitaxial layer on surfaces of a sidewall and a bottom of the recess; forming a second epitaxial layer on a surface of the first epitaxial, wherein a germanium (Ge) concentration of the second epitaxial layer is greater than a Ge concentration of the first epitaxial layer; performing an etching back process to remove a portion of the second epitaxial layer to form a cave in the recess; and forming a third epitaxial layer in the cave, wherein a Ge concentration of the third epitaxial layer is greater than the Ge concentration of the second epitaxial layer.

Base on the disclosure of the present invention, it is an advantage that a cave is formed before forming the third epitaxial layer with high Ge concentration such that the sequentially formed third epitaxial layer can fill the cave to have a large top area and is arranged adjacent to the channel region, which efficiently improve the strain effect.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 are schematic diagrams illustrating the manufacturing method of an epitaxial structure according to a first embodiment of the present invention, wherein:

FIG. 1 is a schematic drawing of a cross-sectional view of the epitaxial structure after performing the first and second steps mentioned in the first embodiment;

FIG. 2 is a schematic drawing in a step subsequent to FIG. 1;

FIG. 3 is a schematic drawing in a step subsequent to FIG. 2;

FIG. 4 is a schematic drawing in a step subsequent to FIG. 3;

FIG. 5 is a schematic drawing in a step subsequent to FIG. 4; and

FIG. 6 is a schematic drawing in a step subsequent to FIG. 5.

FIG. 7 and FIG. 8 are schematic diagrams illustrating the manufacturing method of an epitaxial structure according to a second embodiment of the present invention, wherein:

FIG. 7 is a schematic drawing of a cross-sectional view of the epitaxial structure following the process illustrated in FIG. 2; and FIG. 8 is a schematic drawing in a step subsequent to FIG. 7.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate on the contents and effects to be achieved.

Figure 1:
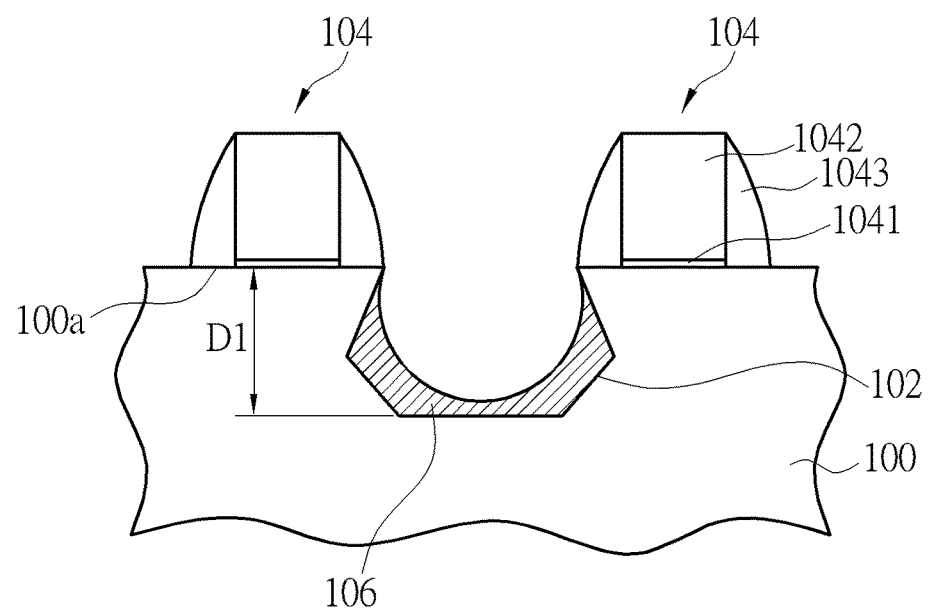
Figure 9:
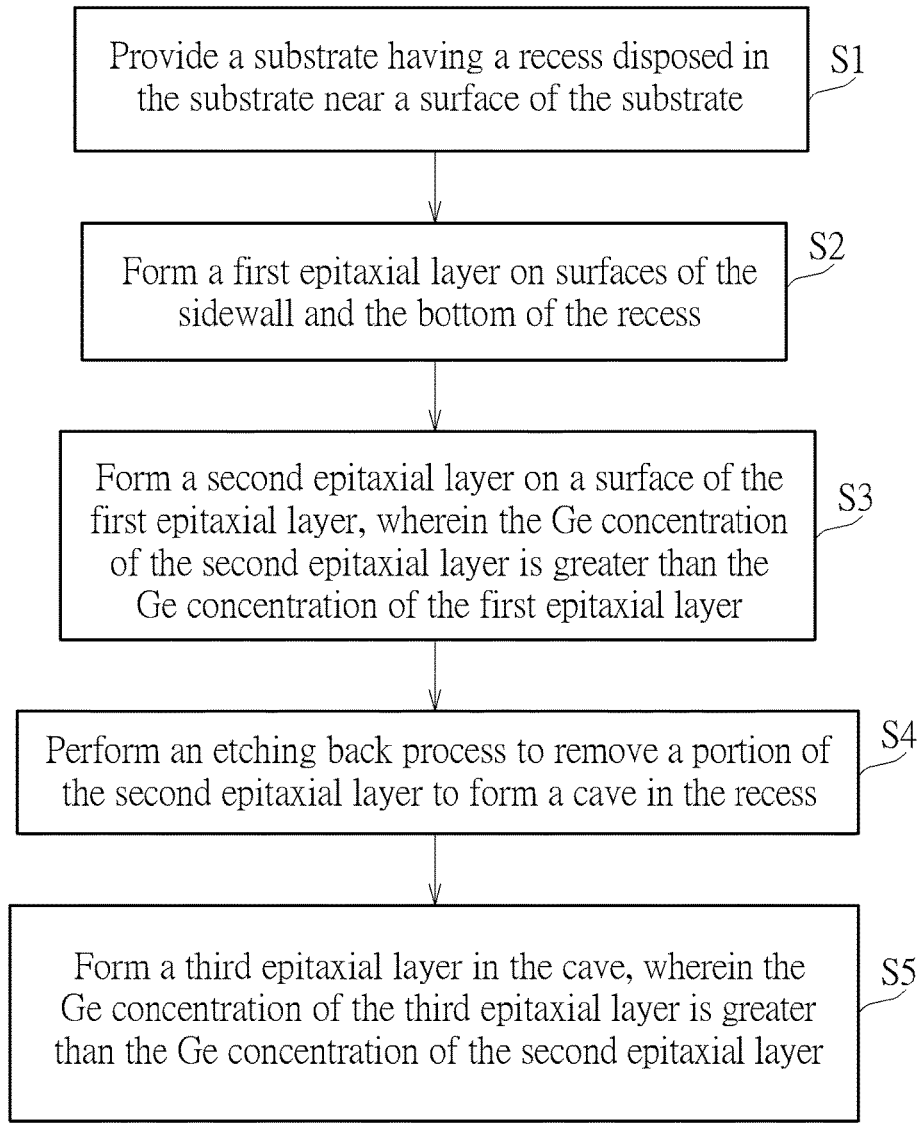
FIG. 9 is a schematic diagram illustrating the process flow of the manufacturing method of an epitaxial structure according to the present invention.

Please refer to FIG. 1 to FIG. 6 and FIG. 9. FIG. 1 to FIG. 6 are schematic diagrams illustrating the manufacturing method of an epitaxial structure according to a first embodiment of the present invention, which also illustrate the cross-sectional views of the epitaxial structure. FIG. 9 is a schematic diagram illustrating the process flow of the manufacturing method of an epitaxial structure according to the present invention. First, as shown in FIG. 1 and FIG. 9, the step S1 is performed to provide a substrate 100, wherein a recess 102 is disposed in the substrate 100 near the surface 100a of the substrate 100. The substrate 100 may be a semiconductor substrate (such as a silicon substrate), a silicon containing substrate (such as a silicon carbide substrate), an III-V group-on-silicon (such as GaN-on-silicon)

substrate, a graphene-on-silicon substrate, a silicon-on-insulator (SOI) substrate or an epitaxial layer containing substrate, but not limited thereto. The formation of the recess 102 may comprise one or more etching process, including but not limited to a dry process such as a plasma etching process, a wet etching process, or a combination of both. For example, an etchant such as carbon tetrafluoride ($CF_4$), HF, tetramethylammonium hydroxide (TMAH), or combinations of thereof, or the like may be used to perform the wet etch process, so as to form the recess 102. The formed recess 102 has a recess depth D1 which is, but not limited to, about 500-1000 angstroms in this embodiment.

In addition, two gate structures 104 are selectively formed on the surface 100a of the substrate 100, wherein each of the gate structures 104 includes a gate insulating layer 1041 disposed on the surface 100a of the substrate 100, a gate portion 1042 disposed above the dielectric layer 1041, and a spacer 1043 surrounding the gate portion 1042. In this embodiment, the recess 102 is formed in the source/drain region near the gate structures 104. More specifically, the formed recess 102 is disposed between the two adjacent gate structures 104. The gate insulating layer 1041 may be composed of dielectric material such as oxides or nitrides, but not limited thereto. The gate insulating layer 1041 could also be composed of pad oxide or a high-k dielectric layer composed of HfSiO, HfSiON, HfO, LaO, LaAlO, ZrO, ZrSiO, or HfZrO. The gate portion 1042 may be a silicon layer including an amorphous silicon layer, a polysilicon layer, a single silicon layer with doped silicon layer, or a composite silicon layer with combination of aforementioned silicon layers. The gate portion 1042 may also include metal materials or be composed of metal layer and other functional or optional layers (not shown), such as work function layer(s) and barrier layer(s). In addition, a cap layer (not shown) may be selectively disposed on the gate portion 1042. The spacer 1043 can be a single layer or a composite layer, which may be composed of high temperature oxide (HTO), silicon nitride, silicon oxide or silicon nitride (HCD-SiN) formed by hexachlorodisilane ($Si_2Cl_6$), but not limited thereto.

Next, the step S2 is performed to form a first epitaxial layer 106 on surfaces of the sidewall and the bottom of the recess 102. The first epitaxial layer 106 has a low Ge concentration, which is less than and equal to 30%, or less than and equal to 25%. The Ge concentration of the whole first epitaxial layer 106 may be substantially fixed to a certain value or to a certain range uniformly, such as ranging from 25% to 30%, but not limited thereto. However, the first epitaxial layer 106 may have a gradient Ge concentration upwardly increased. For example, the Ge concentration of the first epitaxial layer 106 may be upwardly increased from about 0% to about 30%. A selective epitaxial growth (SEG) process may be carried out to form the first epitaxial layer 106. The SEG process may include, but not limited to, a low pressure chemical vapor deposition (LPCVD) process. For example, the SEG process can use dichlorosilane ($SiH_2Cl_2$, DCS) as a silicon source, germane ($GeH_4$) as a germanium source, HCl or $Cl_2$ as an etchant to provide selectivity during the deposition and hydrogen ($H_2$) as a carrier gas, so as to control selective growth. However, in other embodiments, deposition and etching processes may be separately and independently performed in separate processing steps.

Figure 2:
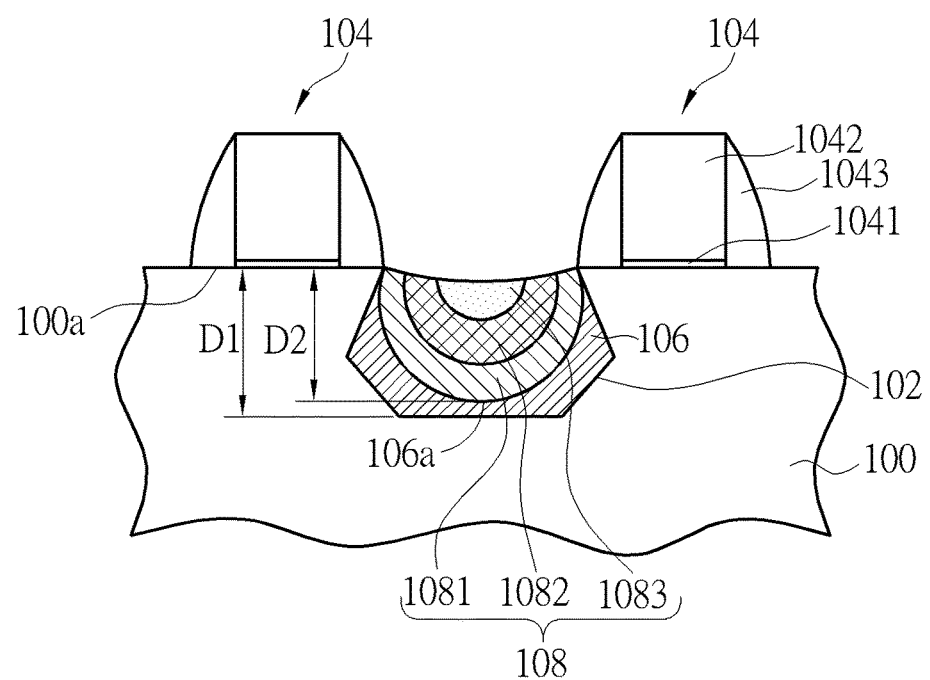

Sequentially, as shown in FIG. 9 and FIG. 2, the step S3 is executed to form a second epitaxial layer 108 on the surface of the first epitaxial layer 106. The second epitaxial layer 108 is a bulk epitaxial layer and is directly in contact with the first epitaxial layer 106, and the bottom boundary 106a of the first epitaxial layer 106 and the second epitaxial layer 108 is positioned around ⅔ of the recess depth D1 as an example. The second epitaxial layer 108 formed in the step S3 of forming the second epitaxial layer 108 substantially fills the recess 102. The Ge concentration of the second epitaxial layer 108 is greater than the Ge concentration of the first epitaxial layer 106. It should be noted that second epitaxial layer 106 has a gradient Ge concentration upwardly increased. Preferably, the Ge concentration of the second epitaxial layer 108 is greater than about 30% and less than about 45% or about 40%. For example, the second epitaxial layer 108 may include at least three portions according to different ranges of Ge concentration: the first portion 1081, the second portion 1082, and the third portion 1083, but not limited thereto. The first portion 1081 has a Ge concentration ranges from about 30% to about 35% and is positioned on the surface of the first epitaxial layer 106. The second portion 1082 has a Ge concentration ranges from about 35% to about 40% and is positioned on the surface of the first portion 1081. The third portion 1083 has a Ge concentration ranges from about 40% to about 45% and is positioned on the surface of the second portion 1082. Specifically, the first portion 1081, the second portion 1082, and the third portion 1083 are arranged as a part of three concentric circles, which means the first portion 1081 surrounds the lower side of the second portion 1082, and the second portion 1082 surrounds the lower side of the third portion 1083. The formation of the second epitaxial layer 108 can include a SEG process, which may adopt the same precursor, material source, and etchant and other process parameters as the formation of the first epitaxial layer 106. It should be noted that since the Ge concentration of the second epitaxial layer 108 is increased gradient, the flow ratio of the source of Ge to the source of Si may be advanced by steps, for instance. In various embodiments, the second epitaxial layer 108 has a linear distribution of Ge concentration, wherein the boundaries between the first, second, and third portions 1081, 1082, and 1083 cannot be clearly defined.

Figure 3:
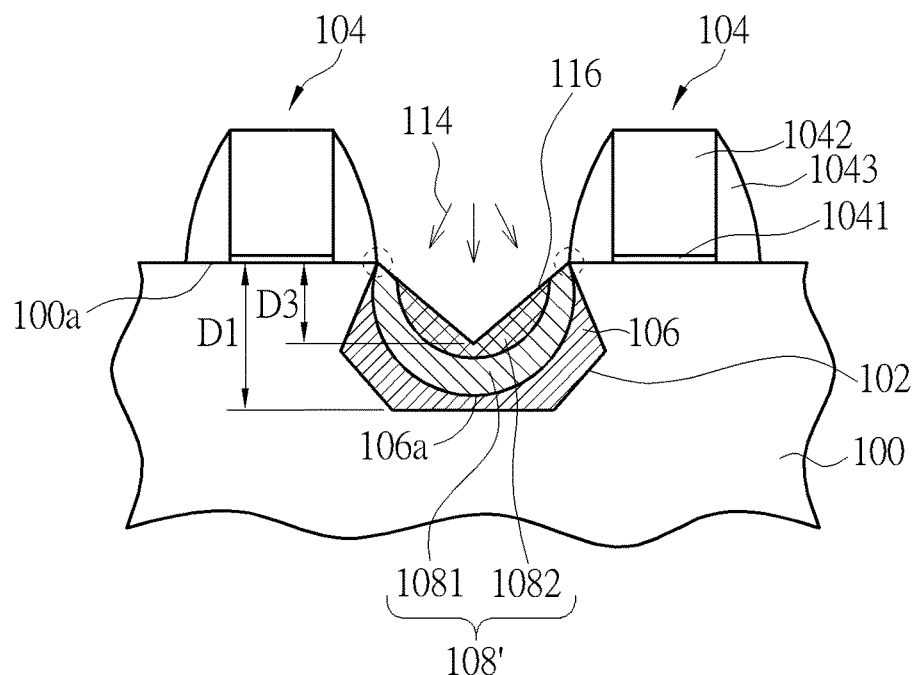

Then, referring to FIG. 3 and FIG. 9, the step S4 is executed to perform an etching back process 114 to remove a portion of the second epitaxial layer 108 in order to form a cave 116 in the recess 102. In this embodiment, the sectional cross-sectional profile of the cave 116 preferably is a V-shaped structure, but not limited thereto. The etching back process 114 includes a dry etching process, a wet etching process, or combination thereof. In addition, the etching back process 114 is controlled and tuned to ensure removal of the certain portion of the second epitaxial layer 108 in order to obtain a preferable shape of the cave 116. For example, etching parameters of the dry and/or wet etching processes can be tuned, such as etchants, etching temperature, etching solution concentration, etching pressure, source power, RF bias voltage, RF bias power, etchant flow rate, and other suitable parameters. In this embodiment, the etching back process 114 is a dry etching process that uses a chlorine-containing gas, such as HCl, $Cl_2$, other chlorine-containing gases, or a combination thereof. However, other etchant may also be used in the dry etching process, such as a fluorine-containing gas (such as HF, NF3, SF6, CF4, other fluorine-containing gases, or combinations thereof), a silicon-containing gas (such as DCS, $SiCH_3$, other silicon-containing gas, or a combination thereof), other gas, or a combination thereof. In a preferred embodiment, HCl is used as the etchant because of that HCl may be also used during the SEG processes in the formation of the first epitaxial layer 106 and the formation of the second epitaxial layer 108, such that the etching back process 114 can be in-situ performed with the aforementioned SEG processes, in the same chamber of forming the epitaxial layers. Preferably, the etching back process 114 is continuously executed until the opening fringe of the cave 116 (as marked by the dotted circles) is close to the opening fringe of the recess 102, which means the top opening of the cave 116 reaches the gate structures 104 and close to the channel regions below the gate structures 104. Alternatively, the etching back process 114 can be continuously carried out until the depth D3 of the cave 116 reaches about ½ of the recess depth D1 to about ¾ of the recess depth D1, wherein the depth D3 of the cave 116 can be defined by the distance of the lowest point of the V-shaped structure and the top surface 100a of the substrate 100. It should be noted that the third portion 1083 of the second epitaxial layer 108 is substantially removed and the upper part of the second portion 1082 and the first portion 1081 of the second epitaxial layer 108 near the gate structures 104 are also removed in the etching back process 114. The remained second epitaxial layer is numbered as 108', composed of the residual first portion 1081 and second portion 1082.

Figure 4:
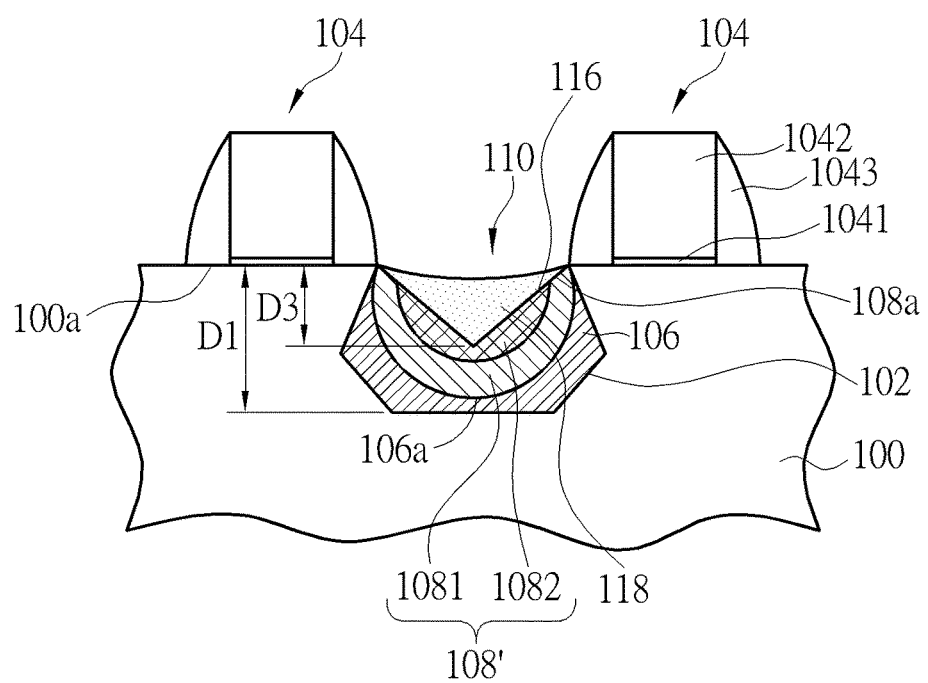

Then, as shown in FIG. 4 and FIG. 9, the step S5 is performed to form a third epitaxial layer 118 in the cave 116, wherein the Ge concentration of the third epitaxial layer 118 is greater than the Ge concentration of the second epitaxial layer 108. Preferably, the third epitaxial layer 118 fully fills the cave 116 and has a fixed high Ge concentration ranges from about 40% to about 45%. The composition concentration of the third epitaxial layer 118 may be uniform in this embodiment. The formation method and parameters of the third epitaxial layer 118 may be referred to the aforementioned paragraphs of the formation of the first epitaxial layer 106 and the second epitaxial layer 108, thus redundant description will not be repeated herein. After the formation of the third epitaxial layer 118, the manufacture of the epitaxial structure 110 of semiconductor device according to the present invention is completed. Therefore, the epitaxial structure 110 of semiconductor device according to the present invention includes a substrate 100, a recess 102, a first epitaxial layer 106, a second epitaxial layer 108', and a third epitaxial layer 118. The recess 102 is formed in the substrate 100 and disposed near the surface 100a of the substrate, wherein the recess 102 has a recess depth D1. The first epitaxial layer 106 is disposed on surfaces of the sidewall and the bottom of the recess 102. The second epitaxial layer 108' is disposed on the surface of the first epitaxial layer 106, wherein the Ge concentration of the second epitaxial layer 108' is greater than the Ge concentration of the first epitaxial layer 106. In addition, the third epitaxial layer 118 is disposed on the surface of the second epitaxial layer 108', wherein the Ge concentration of the third epitaxial layer 118 is greater than the Ge concentration of the second epitaxial layer 108', and the depth D3 of the third epitaxial layer 118 is about ½ to about ¾ of the recess depth D1.

According to the present invention, since the third epitaxial layer 118 with the highest and fixed Ge concentration fully fills the cave 116, the boundary 108a between the top portion of the third epitaxial layer 118 and the second epitaxial layer 108 is close to the opening fringe of the recess 102. Therefore, the third epitaxial layer 118 with high Ge concentration has a large top area covering a portion of the substrate 100 that is positioned between the gate structures 104 and is in contact with the channel region positioned below the gate structures 104, such that the strain of channel can be effectively improved. In addition, since most part of the third epitaxial layer 118 is deposited on the second portion 1082 with a medium range of Ge concentration, not the first portion 1081 of the second epitaxial layer 108, the third epitaxial layer 118 with high Ge concentration can be formed with good crystalline structure, without dislocation and stacking fault. Moreover, the V-shaped cave 116 also provides an advantage to further avoid dislocation when depositing the third epitaxial layer 118.

Figure 5:
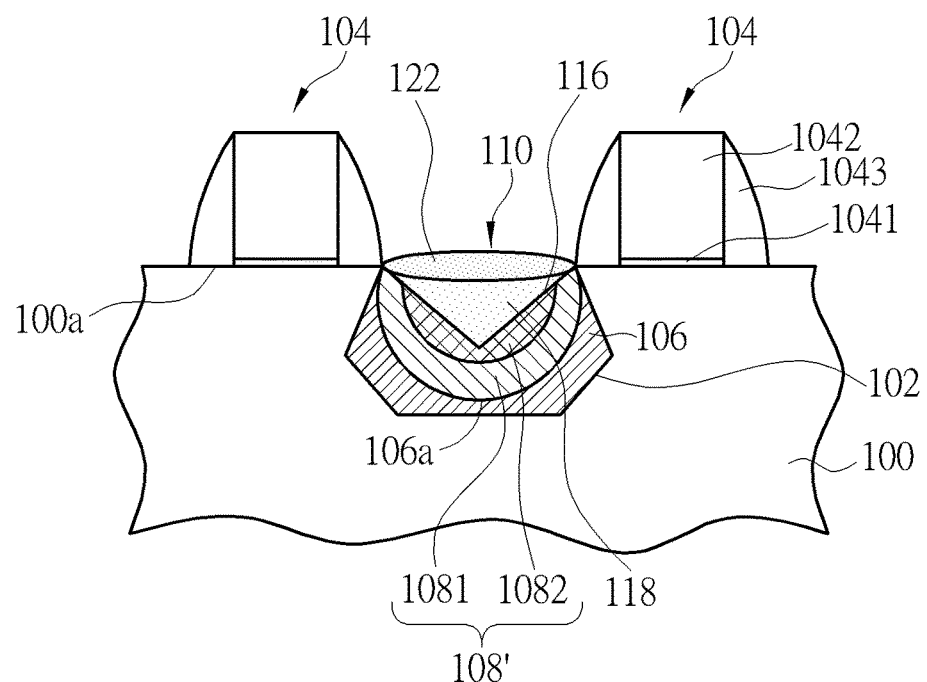
Figure 6:
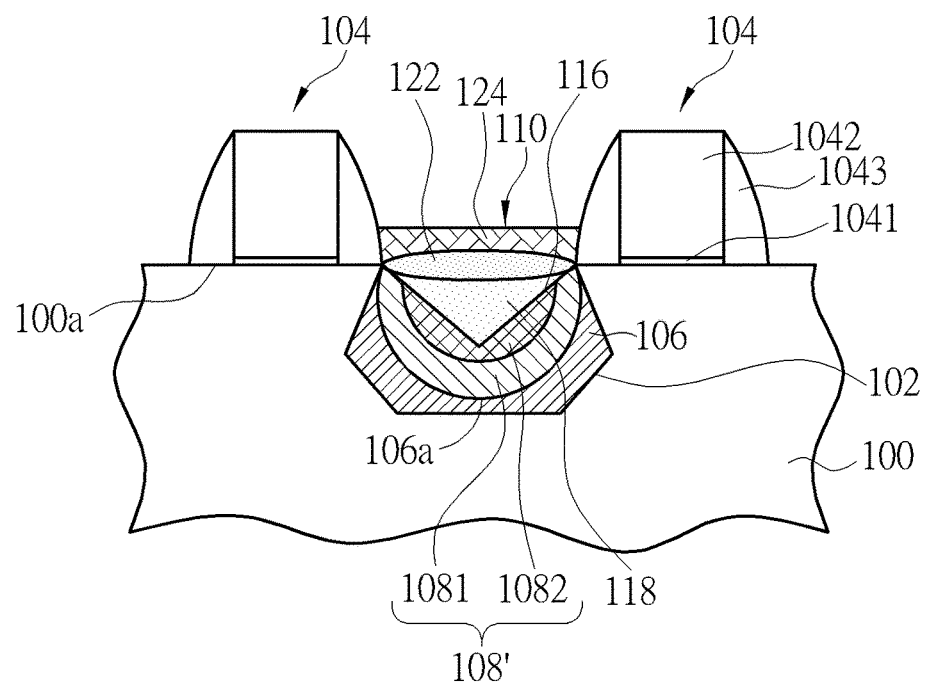

In addition, after the formation of the third epitaxial layer 118 of the present invention, a SiGe cap layer and a doped silicon cap (Si-cap) layer may be further formed on the third epitaxial layer 118. Referring to FIG. 5, the SiGe cap layer 122 is deposited on the third epitaxial layer 118, wherein the Ge concentration of the SiGe cap layer 122 may be decreased upwardly in gradient from about 40% or 45% to about 0%, for instance. In this situation, the SiGe cap layer 122 may have a linear distribution of Ge concentration from bottom to top. Then, as shown in FIG. 6, a Si-cap layer 124 is formed to cover the SiGe cap layer 122, wherein the Si-cap layer 124 may be doped with dopants such as boron. The SiGe cap layer 122 and the Si-cap layer 124 may be deposited through CVD processes, but not limited thereto. After the formation of the Si-cap layer 124, other fabrication processes of semiconductor device may be further performed.

The epitaxial structure of semiconductor device of the present invention and the manufacturing method thereof are not limited by the aforementioned embodiment, and may have other different preferred embodiments. To simplify the description, the identical components in each of the following embodiment are marked with identical symbols. For making it easier to compare the difference between the embodiments, the following description will detail the dissimilarities among different embodiments and the identical features will not be redundantly described.

Figure 7:
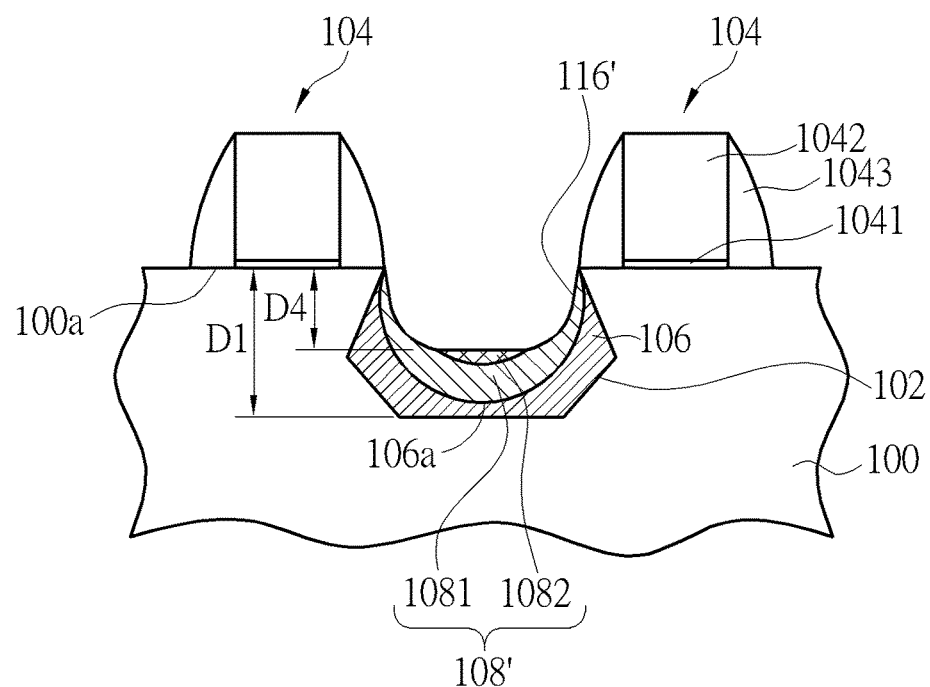
Figure 8:
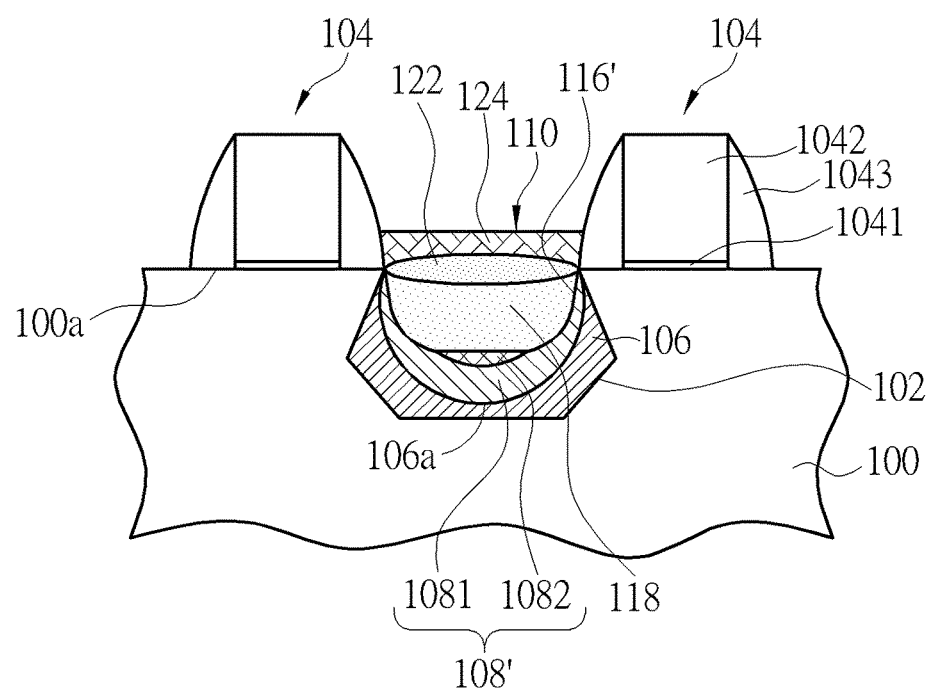

Please refer to FIG. 7 and FIG. 8. FIG. 7 and FIG. 8 are schematic diagrams illustrating the manufacturing method of an epitaxial structure according to a second embodiment of the present invention, wherein FIG. 7 shows the profile of the epitaxial structure following the process illustrated in FIG. 2. As shown in FIG. 7, this embodiment is different from the first embodiment in that the cave 116' formed during the etching back process (not shown in FIG. 7 and FIG. 8) has a profile of U-shaped structure in sectional view. The depth D4 of the U-shaped cave 116' is about ½ to about ¾ of the recess depth 102. With reference to FIG. 8, after forming the cave 116', the third epitaxial layer 118 is deposited to fully fill the cave 116', and the SiGe cap layer 122 and the Si-cap layer may be optionally formed on the third epitaxial layer 118. Therefore, the third epitaxial layer 118 of the epitaxial structure 110 in the second embodiment of the present invention has a U-shaped boundary. Similarly, the top part of the third epitaxial layer 118 has a large area near the channel region, and the strain effect can also be improved.

To summarize, the present invention provides an epitaxial structure of semiconductor and a manufacturing method thereof that can improve the strain effect for the cannel region by the way of forming a cave after the deposition of SiGe bulk with a gradient Ge concentration and filling the cave with the third epitaxial layer having fixed high Ge concentration. As a result, the third epitaxial layer has a large top area and is very close to the channel region located below the gate structures, so as to gain the expected strain effect. In addition, since the etchant of the etching back process that forms the cave can adopt HCl and/or $Cl_2$ which may be already used in the deposition process of epitaxial process, the etching back process may be in-situ performed with the deposition process of epitaxial layers. Accordingly, the total fabrication process is very simple without extra process cost and procedures in comparison with prior-art process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An epitaxial structure of semiconductor device, comprising:
   a substrate;
   a recess in the substrate disposed near a surface of the substrate, wherein the recess has a recess depth;
   a first epitaxial layer disposed on surfaces of a sidewall and a bottom of the recess;
   a second epitaxial layer disposed on a surface of the first epitaxial layer, wherein a germanium (Ge) concentration of the second epitaxial layer is greater than a Ge concentration of the first epitaxial layer; and
   a third epitaxial layer disposed on a surface of the second epitaxial layer, wherein a Ge concentration of the third epitaxial layer is greater than the Ge concentration of the second epitaxial layer and a depth of the third epitaxial layer is about ½ to about ¾ of the recess depth.

2. The epitaxial structure of semiconductor device according to claim 1, wherein a cross-sectional profile of the third epitaxial layer is a V-shaped structure or a U-shaped structure.

3. The epitaxial structure of semiconductor device according to claim 1, wherein a boundary between a top portion of the third epitaxial layer and the second epitaxial layer reaches an opening fringe of the recess.

4. The epitaxial structure of semiconductor device according to claim 1, wherein a composition concentration of the third epitaxial layer is uniform.

5. The epitaxial structure of semiconductor device according to claim 4, wherein the Ge concentration of the third epitaxial layer ranges from about 40% to about 45%.

6. The epitaxial structure of semiconductor device according to claim 1, wherein the second epitaxial layer has gradient Ge concentration upwardly increased.

7. The epitaxial structure of semiconductor device according to claim 6, wherein the Ge concentration of the second epitaxial layer is greater than about 30% and less than about 40%.

8. The epitaxial structure of semiconductor device according to claim 1, wherein a composition concentration of the first epitaxial layer is uniform.

9. The epitaxial structure of semiconductor device according to claim 8, wherein the Ge concentration of the first epitaxial layer ranges from about 25% to about 30%.

10. The epitaxial structure of semiconductor device according to claim 1, wherein the first epitaxial layer has gradient Ge concentration upwardly increased.

11. The epitaxial structure of semiconductor device according to claim 10, wherein the Ge concentration of the first epitaxial layer is upwardly increased from about 0% to about 30%.

12. The epitaxial structure of semiconductor device according to claim 1, wherein a bottom portion of a boundary between the first epitaxial layer and the second epitaxial layer is positioned around ⅔ of the recess depth.

13. A manufacturing method of an epitaxial structure, comprising:
    providing a substrate, wherein a recess is disposed in the substrate near a surface of the substrate;
    forming a first epitaxial layer on surfaces of a sidewall and a bottom of the recess;
    forming a second epitaxial layer on a surface of the first epitaxial layer, wherein a germanium (Ge) concentration of the second epitaxial layer is greater than a Ge concentration of the first epitaxial layer;
    performing an etching back process to remove a portion of the second epitaxial layer to form a cave in the recess; and
    forming a third epitaxial layer in the cave, wherein a Ge concentration of the third epitaxial layer is greater than the Ge concentration of the second epitaxial layer.

14. The manufacturing method of an epitaxial structure according to claim 13, wherein the recess has a recess depth, and the cave has a depth ranges from about ½ of the recess depth to about ¾ of the recess depth.

15. The manufacturing method of an epitaxial structure to claim 13, wherein a sectional cross-sectional profile of the cave has a V shape or a U shape.

16. The manufacturing method of an epitaxial structure according to claim 13, wherein an opening fringe of the cave reaches an opening fringe of the recess.

17. The manufacturing method of an epitaxial structure according to claim 13, wherein the second epitaxial layer formed in the step of forming the second epitaxial layer substantially fills the recess.

18. The manufacturing method of an epitaxial structure according to claim 13, wherein a composition concentration of the third epitaxial layer is uniform.

19. The manufacturing method of an epitaxial structure according to claim 18, wherein the Ge concentration of the third epitaxial layer ranges from about 40% to about 45%.

20. The manufacturing method of an epitaxial structure according to claim 13, wherein a bottom portion of a boundary between the first epitaxial layer and the second epitaxial layer is positioned around ⅔ of a recess depth of the recess.

* * * * *